(12) United States Patent
Heragu et al.

(10) Patent No.: US 7,550,993 B2
(45) Date of Patent: Jun. 23, 2009

(54) GLITCH REDUCED COMPENSATED CIRCUITS AND METHODS FOR USING SUCH

(75) Inventors: Keerthinarayan P. Heragu, Richardson, TX (US); Rajat Chauhan, Dehradun (IN); Chintamani Keshav Bhaktavatson, Satellite Town (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/859,067

(22) Filed: Sep. 21, 2007

(65) Prior Publication Data

US 2009/0051390 A1 Feb. 26, 2009

Related U.S. Application Data

(60) Provisional application No. 60/957,093, filed on Aug. 21, 2007.

(51) Int. Cl.
*H03K 17/16* (2006.01)
*H03K 19/003* (2006.01)

(52) U.S. Cl. ............... 326/32; 326/30; 326/83; 326/86; 327/108; 327/170

(58) Field of Classification Search .......... 326/30, 326/32, 82–83, 86; 327/108–112, 170
See application file for complete search history.

(56) References Cited

U.S. PATENT DOCUMENTS

| 5,949,268 | A | * | 9/1999 | Miura et al. | 327/278 |
|---|---|---|---|---|---|
| 6,087,847 | A | * | 7/2000 | Mooney et al. | 326/30 |
| 6,288,563 | B1 | * | 9/2001 | Muljono et al. | 326/27 |
| 6,578,156 | B1 | * | 6/2003 | Sugita | 713/502 |
| 6,636,069 | B1 | * | 10/2003 | Muljono | 326/30 |
| 6,801,062 | B2 | * | 10/2004 | Okada | 327/108 |
| 6,836,142 | B2 | * | 12/2004 | Lesea et al. | 326/30 |
| 7,362,127 | B2 | * | 4/2008 | Tokuhiro et al. | 326/30 |
| 2008/0211536 | A1 | * | 9/2008 | Nguyen et al. | 326/30 |

* cited by examiner

*Primary Examiner*—Vibol Tan
*Assistant Examiner*—Jason Crawford
(74) *Attorney, Agent, or Firm*—Dawn V. Stephens; Wade James Brady, III; Frederick J. Telecky, Jr.

(57) ABSTRACT

Various embodiments of the present invention provide systems and methods for glitch reduced circuits. As one example, a glitch reduced, variable width driver circuit is disclosed. Such circuits include a data output, and at least two transistors that each includes a gate, a first leg and a second leg. The gate of the first transistor is electrically coupled to a first combined control signal, and the gate of the second transistor is electrically coupled to a second combined control signal. The first leg of the first transistor and the first leg of the second transistor are electrically coupled to a power source, and the second leg of the first transistor and the second leg of the second transistor are electrically coupled to an output signal. The circuits further include a control circuit that combines a first control signal with the data output to create the first combined control signal, and combines a second control signal with the data output to create the second combined control signal.

19 Claims, 6 Drawing Sheets

GLITCH REDUCED COMPENSATED CIRCUITS AND METHODS FOR USING SUCH

CROSS REFERENCE TO RELATED APPLICATION

The present application claims priority to (i.e., is a non-provisional of) U.S. Pat. App. No. 60/957,093 entitled "Glitch Reduced Compensated Circuits and Methods for Using Such", and filed Aug. 21, 2007 by Heragu et al. The aforementioned application is assigned to an entity common hereto, and the entirety of the aforementioned application is incorporated herein by reference for all purposes.

BACKGROUND OF THE INVENTION

The present invention is related to compensated driver, and more particularly to approaches for providing compensated constant drive driver with minimal glitching.

Semiconductor devices typically include one or more internal functional blocks and one or more drivers. The internal functional blocks are designed to perform a particular function and to provide the results of the function external to the semiconductor device via the driver. Such semiconductor devices are often employed in environments where one or more of the supply voltage or temperature varies. Even with such variance, a driver buffer may be expected to maintain a reasonably constant drive impedance independent of the aforementioned variations. Further, the drive impedance may be maintained reasonably constant across different devices where the process values may vary substantially from one device to another. Maintaining this constant impedance assures a reasonable match between the driver buffer and the effective impedance of board traces modeled as transmission lines, and thereby reduces the reflections due to impedance mismatch. Reducing the impedance mismatch is helpful in maintaining signal integrity.

In some cases, maintaining constant drive impedance is achieved by modifying the effective width of the final stage drive transistors on the semiconductor device. Such an approach provides a reasonable approach to maintaining constant impedance, however, such an approach of increasing or decreasing the width of a drives stage has proven problematic for one or more reasons.

Thus, for at least the aforementioned reasons, there exists a need in the art for advanced systems and devices for providing drivers.

BRIEF SUMMARY OF THE INVENTION

The present invention is related to compensated driver, and more particularly to approaches for providing compensated driver with minimal glitching.

Various embodiments of the present invention provide variable width driver circuits. Such circuits include a data output, and at least two transistors that each includes a gate, a first leg and a second leg. The gate of the first transistor is electrically coupled to a first combined control signal, and the gate of the second transistor is electrically coupled to a second combined control signal. The first leg of the first transistor and the first leg of the second transistor are electrically coupled to a power source, and the second leg of the first transistor and the second leg of the second transistor are electrically coupled to an output signal. The circuits further include a control circuit that combines a first control signal with the data output to create the first combined control signal, and combines a second control signal with the data output to create the second combined control signal. In particular instances of the aforementioned embodiments, a width of the first transistor is substantially equivalent to a width of the second transistor. In other instances of the aforementioned embodiments, a width of the second transistor is approximately double a width of the first transistor.

In particular instances of the aforementioned embodiments, combining the first control signal with the data output includes gating the first control signal with the data output, and combining the second control signal with the data output includes gating the second control signal with the data output. In other instances of the aforementioned embodiments, combining the first control signal with the data output includes applying the first control signal and the data output to a logic gate, and registering an output of the logic gate synchronous to a clock. Further, the second control signal and the data output are applied to another logic gate, and an output of the other logic gate is registered synchronous to the clock to generate the second combined control signal. In some such cases, the first control signal and the second control signal are part of a VTP code.

Other embodiments of the present invention include methods for providing drivers. Such methods include providing a data output, a first and second control signal, and a driver buffer. The driver buffer includes at least two transistors that each includes a gate, a first leg and a second leg. The gate of the first transistor is electrically coupled to a first combined control signal, and the gate of the second transistor is electrically coupled to a second combined control signal. The first leg of the first transistor and the first leg of the second transistor are electrically coupled to a power source, and the second leg of the first transistor and the second leg of the second transistor are electrically coupled to an output signal. The methods further include combining the first control signal with the data output to create the first combined control signal, and combining the second control signal with the data output to create the second combined control signal.

Yet other embodiments of the present invention provide driver systems that include a data output, a first combined control signal and a second combined control signal. The systems further include a driver buffer with at least two transistors that each includes a gate, a first leg and a second leg. The gate of the first transistor is electrically coupled to the first combined control signal, and the gate of the second transistor is electrically coupled to the second combined control signal. The first leg of the first transistor and the first leg of the second transistor are electrically coupled to a power source, and the second leg of the first transistor and the second leg of the second transistor are electrically coupled to an output signal. The driver systems include a driver controller with a control select circuit and a combining circuit. The control select circuit provides a first control output and a second control output. The combining circuit is operable to combine the first control signal with the data output to create the first combined control signal, and to combine the second control signal with the data output to create the second combined control signal.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 3b shows a driver controller capable of combining data and control lines to drive the six stage, width selectable transistor of FIG. 3a;

FIG. 4b shows a driver controller capable of combining data and control lines to drive the four stage, width selectable transistor of FIG. 4a;

DETAILED DESCRIPTION OF THE INVENTION

Figure 1A:
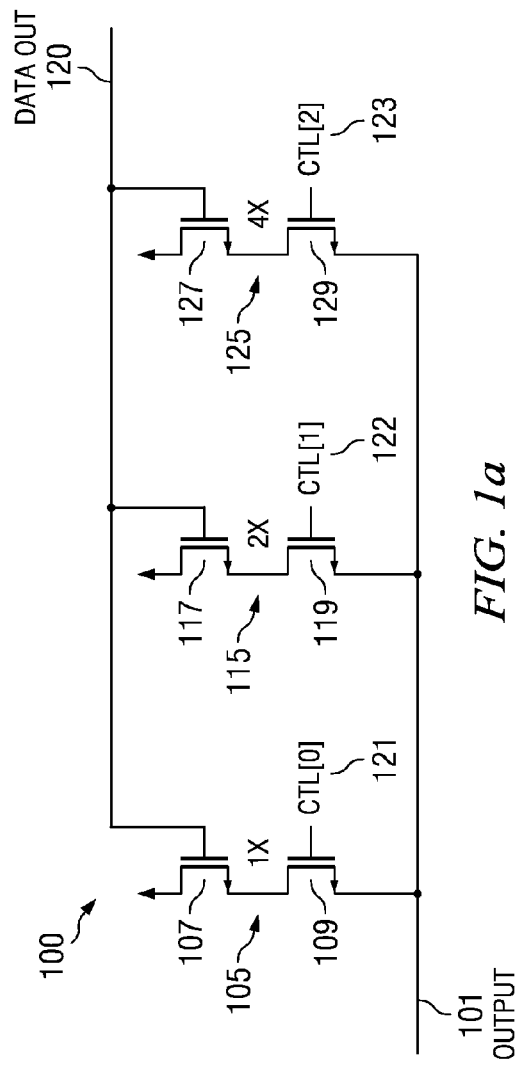
FIG. 1a depicts a prior art three stage, width selectable drive transistor capable of providing between a 1× and 7× width with a resolution of 1×.

The present invention is related to compensated driver, and more particularly to approaches for providing compensated driver with minimal glitching.

Various embodiments of the present invention provide variable width driver circuits. In some instances of the present invention, such driver circuits are constant drive driver circuit. In various particular instances of the present invention, such driver circuits are I/O circuits. In some such instances, the I/O circuits are constant drive I/O circuits. Hence, as used herein, the phrase "driver circuit" is used in its broadest sense to include a number of different types of driver and/or I/O circuits. Such circuits include a data output, and at least two transistors that each includes a gate, a first leg and a second leg. As used herein, the term "gate" is used in its broadest sense to mean any transistor input that controls an output of one of the other legs of the transistor. Further, as used herein, the term "leg" is used in its broadest sense to mean any input or output of a transistor. Thus, as just one example where the transistor is a MOSFET transistor, the first leg may be the source of the transistor, the second leg may be the drain of the transistor, and the gate is the gate of the transistor. Alternatively, the first leg may be the drain of the transistor, the second leg may be the source of the transistor, and the gate is the gate of the transistor. As yet another example where the transistor is a bipolar transistor, the first leg may be the emitter of the transistor, the second leg may be the collector of the transistor, and the gate may be the base of the transistor. Alternatively, the first leg may be the collector of the transistor, the second leg may be the emitter of the transistor, and the gate may be the base of the transistor. Based on the disclosure provided herein, one of ordinary skill in the art will recognize a variety of transistor types including, but not limited to, bipolar transistors, NFET transistors and PFET transistors that may be used in relation to different embodiments of the present invention. Further, based in part on the type of transistor selected, one of ordinary skill in the art will recognize the appropriate electrical connections that may be use based on the disclosure provided herein.

The gate of the first transistor is electrically coupled to a first combined control signal, and the gate of the second transistor is electrically coupled to a second combined control signal. As used herein, the phrase "electrically coupled" is used in its broadest sense to mean any coupling whereby an electrical signal may be passed from one node to another. Thus, for example, two nodes may be electrically coupled via a wire extending between the nodes. As another example, two nodes may be electrically coupled via an intervening electrical circuit or component. The first leg of the first transistor and the first leg of the second transistor are electrically coupled to a power source, and the second leg of the first transistor and the second leg of the second transistor are electrically coupled to an output signal. The circuits further include a control circuit that combines a first control signal with the data output to create the first combined control signal, and combines a second control signal with the data output to create the second combined control signal. In particular instances of the aforementioned embodiments, a width of the first transistor is substantially equivalent to a width of the second transistor. In other instances of the aforementioned embodiments, a width of the second transistor is approximately double a width of the first transistor.

Various embodiments of the present invention provide glitch reduced driver buffers that include combined data and control signals to control various stages or splits of a driver buffer. In this way, data and control may be synchronized such that any glitching at the output of driver buffer due to modification of effective transistor width may be minimized. Further, by controlling application of the combined data and control signal by use of a synchronizing clock, it may be assured that a change in width is fully stable and considered before subsequent change in width is effected. In some cases, Voltage, Temperature and Process (VTP) information is used to determine width adjustments that are to be applied to one or more driver buffers. This VTP information may be used to determine a proper impedance match using known calculations. In some cases of the aforementioned embodiments, reflections are not caused when the effective transistor width is changed synchronous to the clock of the applied data. In some cases of the aforementioned embodiments, a glitch reduced driver buffer uses a binary code for control. In such cases, the relatively small area and simple code signal distribution enabled by a binary code controlled driver buffer may be achieved without unacceptable glitching effects evident in the prior art. In addition, signal reflection often noted in prior art schemes may be substantially reduced or even eliminated.

One or more prior art approaches for maintaining constant drive impedance include adjusting the effective width of the final stage drive transistors of a semiconductor device. This may be accomplished by calibrating the width of the combined transistor with respect to an external load. It has been discovered that the prior art approaches shown in FIGS. 1a-1b may suffer from both glitching at the output when a width change occurs, as well as, significant signal reflection. For example, even when there is no data transition, if a VTP code update coincides with a reflected wave of an earlier data transition, the entire signal could be reflected back. In some such cases, when the splits (i.e., incremental transition widths) that need to turn off post update have already done so and the splits that need to turn on have not yet turned on, reflections may be severe.

Turning to FIG. 1a, a prior art width selectable transistor 100 relying on a binary split is shown. Width selectable transistor 100 includes three transistor sets 105, 115, 125. Transistor set 105 includes two transistors 107, 109 that are each designed with a 1× width. Transistor set 115 includes two transistors 117, 119 that are each designed with a 2× width, and transistor set 125 includes two transistors 127, 129 that are each designed with a 4× width. Transistor sets 105, 115, 125 turn on individually whenever a data output 120 is asserted high at the same time a control input 121, 122, 123 associated with the particular transistor set is asserted high. Width selectable transistor 100 allows for selecting a transistor width of between 1× and 7× with a resolution of 1×. Data output 120 is transmitted as an output 101.

In operation, changes to the width of width selectable transistor 100 are caused by changing the assertion levels of one or more of control lines 121, 122, 123. In some cases, the transistor width is incrementally modified and the drive is checked with respect to a reference resistor. The quantum of widths that need to be turned on is then passed on to other drivers on the semiconductor device that track the width variations. Ideally, control lines 121, 122, 123 change when data output 120 is inactive so that the change does not impact signal integrity of output 101. However, it has been found to be difficult to assure that control lines 121, 122, 123 do not switch at the same time that data output 120 is active. Such a situation may result in a considerable degradation of output 101. The impact may be more significant depending upon the change indicated by control lines 121, 122, 123. For example, a change from a 3× width to a 4× width may involve a change from 3× to 0× and then back to 4× depending upon the timing of control lines 121, 122, 123 in relation to one another. Thus, using the configuration of width selectable transistor 100, a significant impact on an output signal may occur when switching the effective transistor width.

Figure 1B:
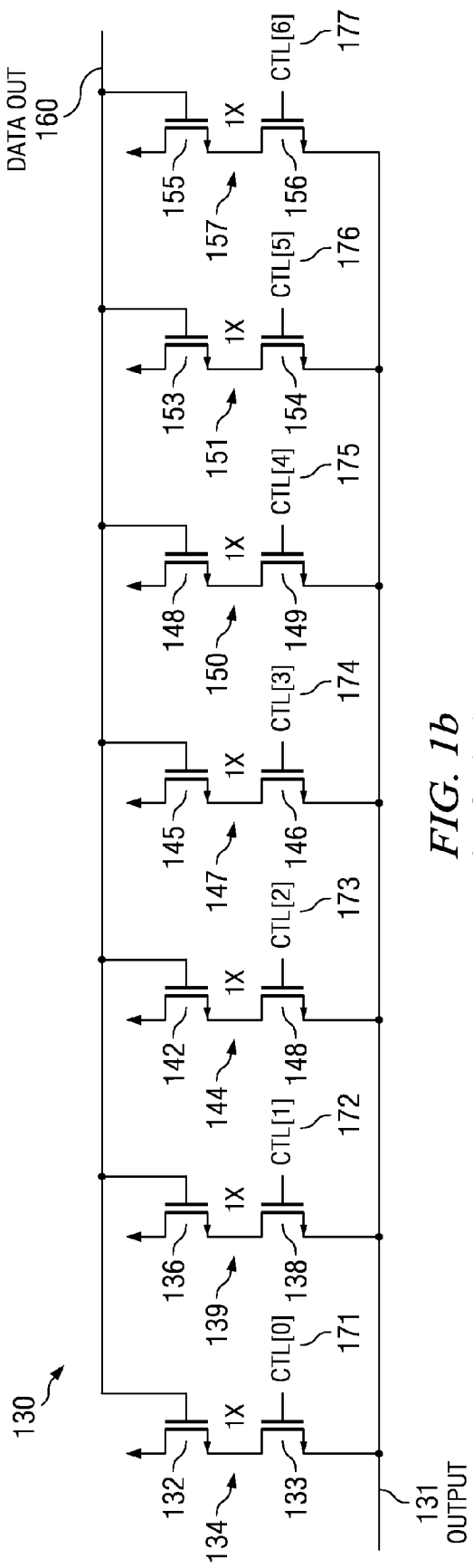
FIG. 1b depicts a prior art seven stage, width selectable drive transistor capable of providing between a 1× and 7× width with a resolution of 1×.

To reduce this substantial impact on a propagated signal, a thermometric code may be used that reduces the amount of any incremental change in the effective transistor width. Turning to FIG. 1b, another prior art width selectable transistor 130 relying on a thermometric split is shown. Width selectable transistor 130 includes seven transistor sets 134, 139, 144, 147, 150, 151, 157. Transistor set 134 includes two transistors 132, 133 that are each designed with a 1× width; transistor set 139 includes two transistors 136, 138 that are each designed with a 1× width, transistor set 144 includes two transistors 142, 143 that are each designed with a 1× width; transistor set 147 includes two transistors 145, 146 that are each designed with a 1× width; transistor set 150 includes two transistors 148, 149 that are each designed with a 1× width; transistor set 151 includes two transistors 153, 154 that are each designed with a 1× width; and transistor set 157 includes two transistors 155, 156 that are each designed with a 1× width. Transistor sets 134, 139, 144, 147, 150, 151, 157, 158 turn on individually whenever a data output 160 is asserted high at the same time a control input 171, 172, 173, 174, 175, 176, 177, 178 associated with the particular transistor set is asserted high. Width selectable transistor 130 allows for selecting a transistor width of between 1× and 7× with a resolution of 1×. Of note, this is the same range and resolution of width selectable transistor 100, but requires substantially more circuitry and chip area. Data output 160 is transmitted as an output 131.

In operation, changes to the width of width selectable transistor 130 are effected by changing the assertion levels of one or more of control lines 171, 172, 173, 174, 175, 176, 177. In some cases, the transistor width is incrementally modified and the drive is checked with respect to a reference resistor. The quantum of widths that need to be turned on is then passed on to other drivers on the semiconductor device that track the width variations. When control lines 171, 172, 173, 174, 175, 176, 177 are switched while data output 160 is active, only a small signal degradation is incurred relative to that incurred by width selectable transistor 130 as an incremental width change only ever involves a change from one incremental width to the next due to the use of the thermometric code driving control lines 171, 172, 173, 174, 175, 176, 177. Thus, width selectable transistor 130 resolves at least some of the potential glitch problems discussed in relation to width selectable transistor 100. However, this glitch reduction comes at a dramatic cost in terms of circuitry, chip area and power.

Figure 2:
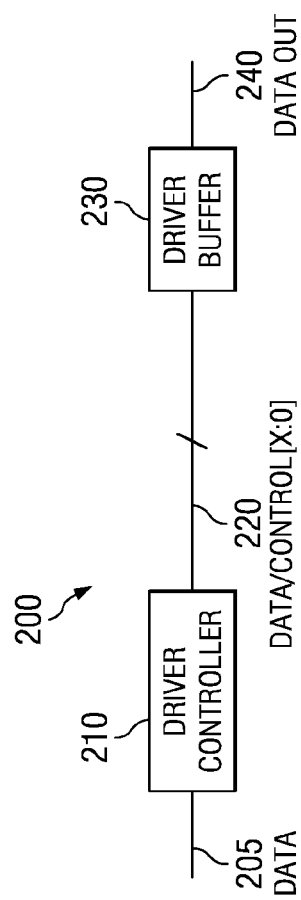
FIG. 2 shows a driver controller and a driver buffer in accordance with one or more embodiments of the present invention.

Turning to FIG. 2, a system 200 including a driver controller 210 and a driver buffer 230 in accordance with one or more embodiments of the present invention is shown. Driver buffer 230 includes a selectable width transistor that may be programmed to maintain a constant drive impedance. Driver controller 210 receives a data signal 205 that is to be transmitted off chip via driver buffer 230. Driver controller 210 is operable to individually combine control signals with data signal 205 to create a set of combined signals, Data/Control [X:0] 220. Combined signals 220 are used to select the width of the width selectable transistor of driver buffer 230. By using individually combined data and control signals, glitch problems such as those discussed above in relation to width selectable transistor 100 and width selectable transistor 130 are reduced or eliminated.

Figure 3A:
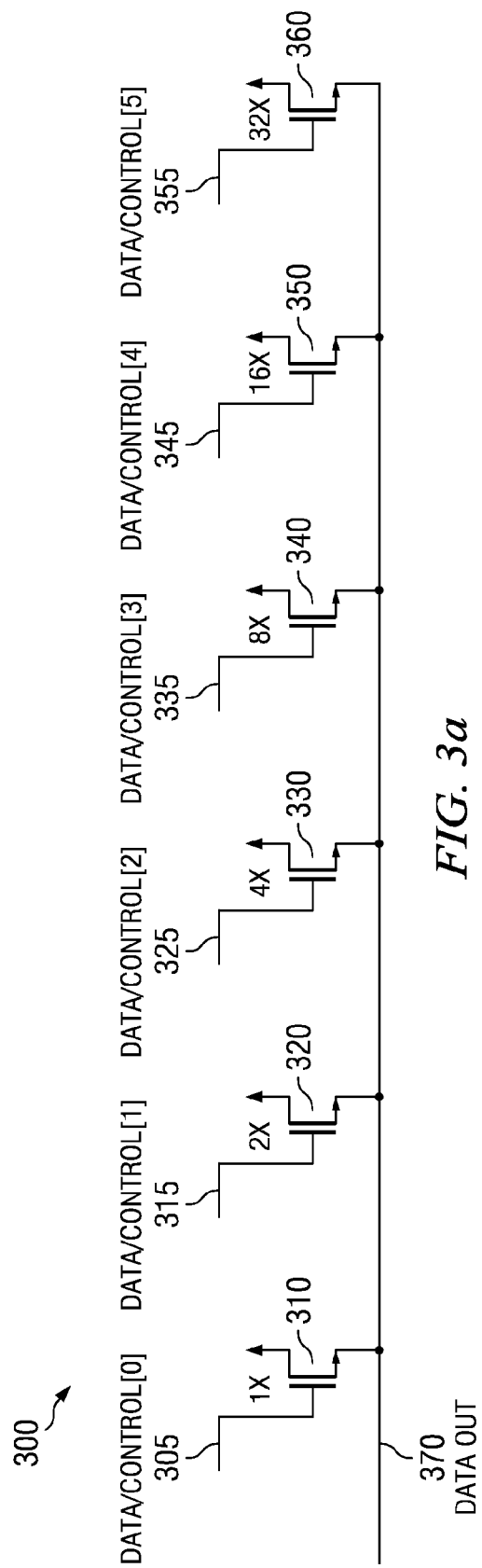
FIG. 3a shows a six stage, width selectable transistor exhibiting binary weighted transistor sizes and combined data and control lines in accordance with various embodiments of the present invention.

FIG. 3a shows an exemplary embodiment of a driver buffer 300 including a variable width transistor including a binary weight split in accordance with various embodiments of the present invention. Driver buffer 300 may be used in place of driver buffer 230 discussed above in relation to FIG. 2. As shown, driver buffer 300 includes six stages exhibiting binary weighted transistor sizes and combined data and control lines. It should be noted, however, that another number of stages may be used in accordance with different embodiments of the present invention. Driver buffer 300 includes a transistor 310 exhibiting a 1× width; a transistor 320 exhibiting a 2× width; a transistor 330 exhibiting a 4× width; a transistor 340 exhibiting an 8× width; a transistor 350 exhibiting a 16× width; and a transistor 360 exhibiting a 32× width. The gate of each of transistors 310, 320, 330, 340, 350, 360 is driven by a respective control line 305, 315, 325, 335, 345, 355. Each of control lines 305, 315, 325, 335, 345, 355 is a synchronized combination of a data output signal and a particular control signal tailored for the respective stage of driver buffer 300. Using the combination control and data lines 305, 315, 325, 335, 345, 355, any width between 1× and 63× may be selected with a resolution of 1×.

It should be noted that a larger or smaller range of widths may be selected by providing more or fewer transistors in driver buffer. Thus, for example, where another transistor with a 64× width is added, the range is extended up to 127× with the same 1× resolution. As another example, by removing transistor 360, the range is reduced down to 31× with the same 1× resolution. As yet another example, where a ½× transistor is added, substantially the same range is possible, but now with a ½× resolution. Based on the disclosure provided herein, one of ordinary skill in the art will recognize an implementation that is capable of providing the width ranges and resolution for a particular design requirement.

In operation, control lines 305, 315, 325, 335, 345, 355 are asserted to select the appropriate ones of transistors 310, 320, 330, 340, 350, 360 to obtain the desired width within the offered range. The drain of each of transistors 310, 320, 330, 340, 350, 360 is connected to a supply voltage, and the source of all of transistors 310, 320, 330, 340, 350, 360 are connected together, and together drive a data output 370. Thus, selecting the desired width has a direct impact on the drive provided to data output 370, and thus the drive impedance. By carefully selecting ones of transistors 310, 320, 330, 340, 350, 360, a constant drive impedance can be offered by driver buffer 300.

In some cases, matching impedances includes incrementally selecting different transistor widths until a match is achieved. As discussed above in relation to FIG. 2, by synchronizing the data output signal and the control signal tailored for the particular stage of driver buffer 230, switching may occur between any incremental resolution within the range with only minimal glitch considerations. In particular, glitching is substantially reduced, and may be ultimately eliminated where routing of control lines 305, 315, 325, 335, 345, 355 is carefully controlled.

Transistors 310, 320, 330, 340, 350, 360 are shown as NMOS transistors. However, it should be noted that PMOS transistors, bipolar transistors, or other circuit elements may be used in accordance with different embodiments of the present invention. Based on the disclosure provided herein, one of ordinary skill in the art will recognize a variety of transistor types, transistor widths, and number of stages that may be used with a synchronized data and control signal in accordance with various embodiments of the present invention to achieve different width ranges and/or width resolutions.

Figure 3B:
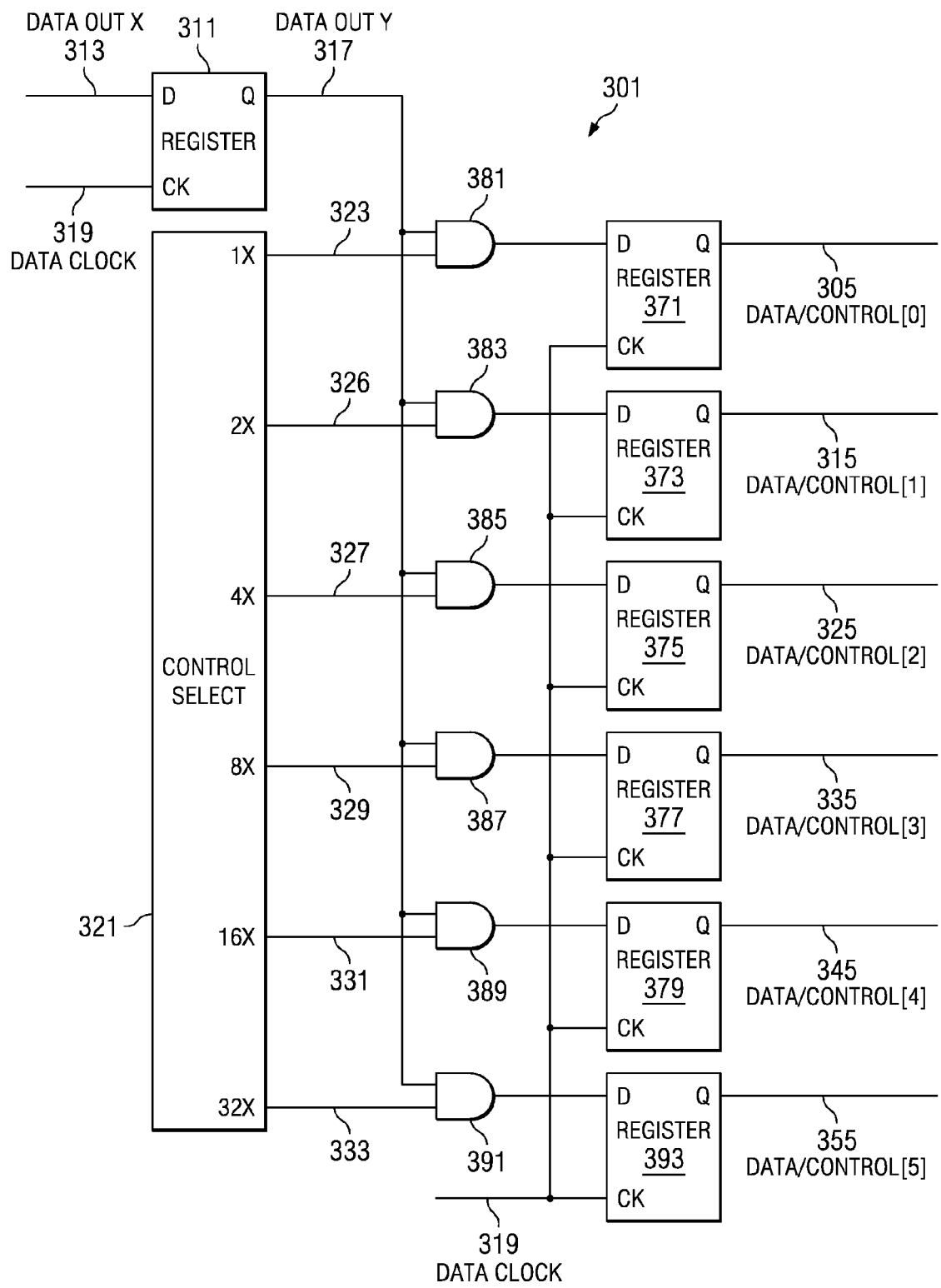

Turning to FIG. 3*b*, shows an exemplary driver controller 301 capable of combining data and control lines to provide control lines 305, 315, 325, 335, 345, 355 for driving the six stage, width selectable transistor of FIG. 3*a*. Driver controller 301 may be used in place of driver controller 210 of FIG. 2. Driver controller 301 includes a control select block 321, a data synchronizing register 311, a set of logic gates 381, 383, 385, 387, 389, 391, and a set of control and data synchronizing registers 371, 373, 375, 377, 379, 393. Data synchronizing register 311 operates to synchronize a data output signal 313 to a data clock 319. In particular, whenever data clock 319 asserts, a data output signal 317 of data synchronizing register 311 is updated to reflect the value of data output signal 313.

Control select block 321 is a circuit that is operable to control the effective width of the transistor by asserting one or more control outputs 323, 326, 327, 329, 331, 333. Control outputs 323, 326, 327, 329, 331, 333 are sometimes referred to as VTP codes as they may be modified to compensate for changes in voltage, temperature and process. In particular, control select block 321 asserts control output 323 high whenever the width of transistor 310 is to be included. Similarly, control output 326 is asserted high whenever the width of transistor 320 is to be included; control output 327 is asserted high whenever the width of transistor 330 is to be included; control output 329 is asserted high whenever the width of transistor 340 is to be included; control output 331 is asserted high whenever the width of transistor 350 is to be included; and control output 333 is asserted high whenever the width of transistor 360 is to be included. The combination of assertions of control outputs 323, 326, 327, 329, 331, 333 allow for the selection of a transistor width between 1× and 63× with a resolution of 1×. Based on the disclosure provided herein, one of ordinary skill in the art will recognize a variety of implementations of control select block 321 that would allow the assertion of control outputs capable of enabling the inclusion of one or more transistors into an effective transistor of desired width. In some cases, control select block 321 is a state machine that is capable of incrementally stepping through transistor widths while an impedance match is determined. It should be noted that a high assertion of control outputs 323, 326, 327, 329, 331, 333 is merely exemplary, and one of ordinary skill in the art will recognize other assertion levels that may be used depending upon, for example, logic gates 381, 383, 385, 387, 389, 391, and the transistors included in driver buffer 300. Also, it should be noted that the width of control select block 321 (i.e., the number of control outputs 323, 325, 327, 329, 331, 333) is tailored to the number of transistors in driver buffer 300. Based on the disclosure provided herein, one of ordinary skill in the art will recognize a variety of widths of control select block 321 that may be used depending upon the number of transistors to be controlled in an associated driver buffer.

Each of control outputs 323, 326, 327, 329, 331 is gated with data output signal 317 using logic gates 381, 383, 385, 387, 389, 391. Thus, where the transistors of driver buffer 300 are designed to turn on when both data output signal 317 and the respective control signal are asserted high, an AND gate may be used for each of logic gates 381, 383, 385, 387, 389, 391. Based on the disclosure provided herein, one of ordinary skill in the art will recognize other gate types that may be used where either of data output signal 317 or control outputs 323, 326, 327, 329, 331, 333 assert at a different level, or where the transistors of driver buffer require a different assertion of a control signal to turn on. Further, based on the disclosure provided herein, one of ordinary skill in the art will recognize other approaches that may be used to generate signals that are a combination of control outputs and data output signal 317 that may be used in relation to one or more embodiments of the present invention.

The output of each of logic gates 381, 383, 385, 387, 389, 391 is applied to the data input of respective ones of the control and data synchronizing registers 371, 373, 375, 377, 379, 393. Control and data synchronizing registers 371, 373, 375, 377, 379, 381 operate to synchronize control outputs 323, 325, 327, 329, 331, 333 and data output signal 317 as combined by logic gates 381, 383, 385, 387, 389, 391 to data clock 319. Each of control and data synchronizing registers 371, 373, 375, 377, 379, 393 provides a respective one of control lines 305, 315, 325, 335, 345, 355 that is applied to respective ones of the transistors of driver buffer 300 as described above in relation to FIG. 3*a*.

Figure 4A:
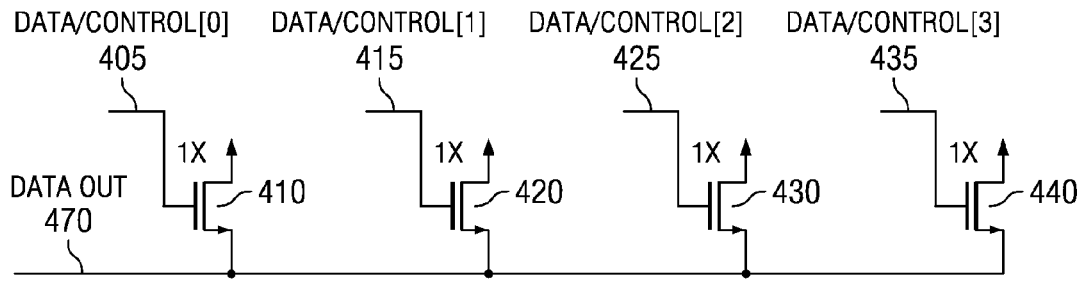
FIG. 4a shows a four stage, width selectable transistor exhibiting equally weighted transistor sizes and combined data and control lines in accordance with various embodiments of the present invention.

FIG. 4*a* shows an exemplary embodiment of a driver buffer 400 including a variable width transistor exhibiting a thermometric width spit in accordance with various embodiments of the present invention. Driver buffer 400 may be used in place of driver buffer 230 discussed above in relation to FIG. 2. As shown, driver buffer 400 includes four stages exhibiting equal sizes and combined data and control lines. Again, it should be noted that another number of stages may be used in accordance with different embodiments of the present invention. Driver buffer 400 includes transistor 410, transistor 420, transistor 430 and transistor 440 that each exhibits a 1× width. The gate of each of transistors 410, 420, 430, 440 is driven by a respective control line 405, 415, 425, 435. Each of control lines 405, 415, 425, 435 is a synchronized combination of a data output signal and a control signal tailored for the particular stage of driver buffer 400. Using the combination control and data lines 405, 415, 425, 435 any width between 1× and 4× may be selected with a resolution of 1×.

It should be noted that a larger or smaller range of widths may be selected by providing more or fewer transistors in driver buffer. Thus, for example, where another transistor with a 1× width is added, the range is extended up to 5× with the same 1× resolution. As another example, by removing transistor 440, the range is reduced down to 3× with the same 1× resolution. Based on the disclosure provided herein, one of ordinary skill in the art will recognize an implementation that is capable of providing the width ranges and resolution for a particular design requirement.

In operation, control lines 405, 415, 425, 435, 345 are asserted to select the appropriate ones of transistors 410, 420, 430, 440 to obtain the desired width within the offered range. The drain of each of transistors 410, 420, 430, 440 is connected to a supply voltage, and the source of all of transistors 410, 420, 430, 440 are connected together, and together drive a data output 370. Thus, selecting the desired width has a direct impact on the drive provided to data output 370, and thus the drive impedance. By carefully selecting ones of transistors 410, 420, 430, 440, a constant drive impedance can be offered by driver buffer 400.

In some cases, matching impedances includes incrementally selecting different transistor widths until a match is achieved. As discussed above in relation to FIG. 2, by synchronizing the data output signal and the control signal tailored for the particular stage of driver buffer 230, switching may occur between any incremental resolution within the range with only minimal glitch considerations. In particular, glitching is substantially reduced, and may be ultimately eliminated where routing of control lines 405, 415, 425, 435 is carefully controlled.

Transistors 410, 420, 430, 440 are shown as NMOS transistors. However, it should be noted that PMOS transistors, bipolar transistors, or other circuit elements may be used in accordance with different embodiments of the present invention. Based on the disclosure provided herein, one of ordinary skill in the art will recognize a variety of transistor types, transistor widths, and number of stages that may be used with a synchronized data and control signal in accordance with various embodiments of the present invention to achieve different width ranges and/or width resolutions.

Figure 4B:
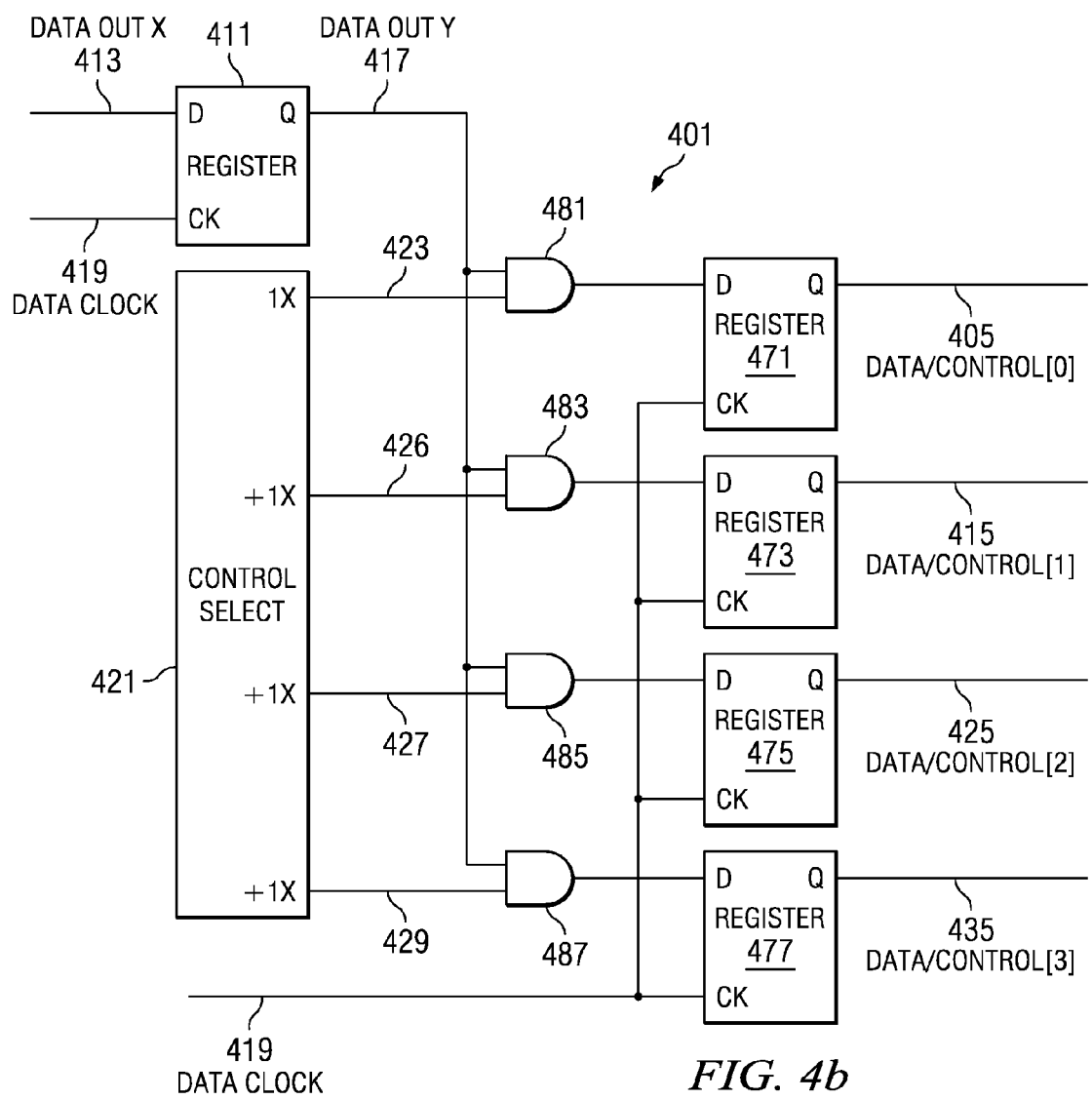

Turning to FIG. 4b, shows an exemplary driver controller 401 capable of combining data and control lines to provide control lines 405, 415, 425, 435 for driving the four stage width selectable transistor of FIG. 4a. Driver controller 401 may be used in place of driver controller 210 of FIG. 2. Driver controller 401 includes a control select block 421, a data synchronizing register 411, a set of logic gates 481, 483, 485, 487, and a set of control and data synchronizing registers 471, 473, 475, 477. Data synchronizing register 411 operates to synchronize a data output signal 413 to a data clock 419. In particular, whenever data clock 419 asserts, a data output signal 417 of data synchronizing register 411 is updated to reflect the value of data output signal 413.

Control select block 421 is a circuit that is operable to control the effective width of the transistor by asserting one or more control outputs 423, 426, 427, 429. Control outputs 423, 426, 427, 429 are sometimes referred to as VTP codes as they may be modified to compensate for changes in voltage, temperature and process. In particular, control select block 421 asserts control output 423 high whenever the width of transistor 410 is to be included. Similarly, control output 426 is asserted high whenever the width of transistor 420 is to be included; control output 427 is asserted high whenever the width of transistor 430 is to be included; and control output 429 is asserted high whenever the width of transistor 440 is to be included. The combination of assertions of control outputs 423, 426, 427, 429 allow for the selection of a transistor width between 1× and 4× with a resolution of 1×. Based on the disclosure provided herein, one of ordinary skill in the art will recognize a variety of implementations of control select block 421 that would allow the assertion of control outputs capable of enabling the inclusion of one or more transistors into an effective transistor of desired width. In some cases, control select block 421 is a state machine that is capable of incrementally stepping through transistor widths while an impedance match is determined. It should be noted that a high assertion of control outputs 423, 426, 427, 429 is merely exemplary, and one of ordinary skill in the art will recognize other assertion levels that may be used depending upon, for example, logic gates 481, 483, 485, 487, and the transistors included in driver buffer 400. Also, it should be noted that the width of control select block 421 (i.e., the number of control outputs 423, 426, 427, 429) is tailored to the number of transistors in driver buffer 400. Based on the disclosure provided herein, one of ordinary skill in the art will recognize a variety of widths of control select block 421 that may be used depending upon the number of transistors to be controlled in an associated driver buffer.

Each of control outputs 423, 426, 427, 429 is gated with data output signal 317 using logic gates 481, 483, 485, 487. Thus, where the transistors of driver buffer 400 are designed to turn on when both data output signal 417 and the respective control signal are asserted high, an AND gate is used for each of logic gates 481, 483, 485, 487. Based on the disclosure provided herein, one of ordinary skill in the art will recognize other gate types that may be used where either of data output signal 417 or control outputs 423, 426, 427, 429 assert at a different level, or where the transistors of driver buffer require a different assertion of a control signal to turn on.

The output of each of logic gates 481, 483, 485, 487 is applied to the data input of respective ones of the control and data synchronizing registers 471, 473, 475, 477. Control and data synchronizing registers 471, 473, 475, 477, operate to synchronize control outputs 423, 426, 427, 429 and data output signal 417 as combined by logic gates 481, 483, 485, 487 to data clock 419. Each of control and data synchronizing registers 471, 473, 475, 477 provides a respective one of control lines 405, 415, 425, 435 that is applied to respective ones of the transistors of driver buffer 400 as described above in relation to FIG. 4a.

Figure 5:
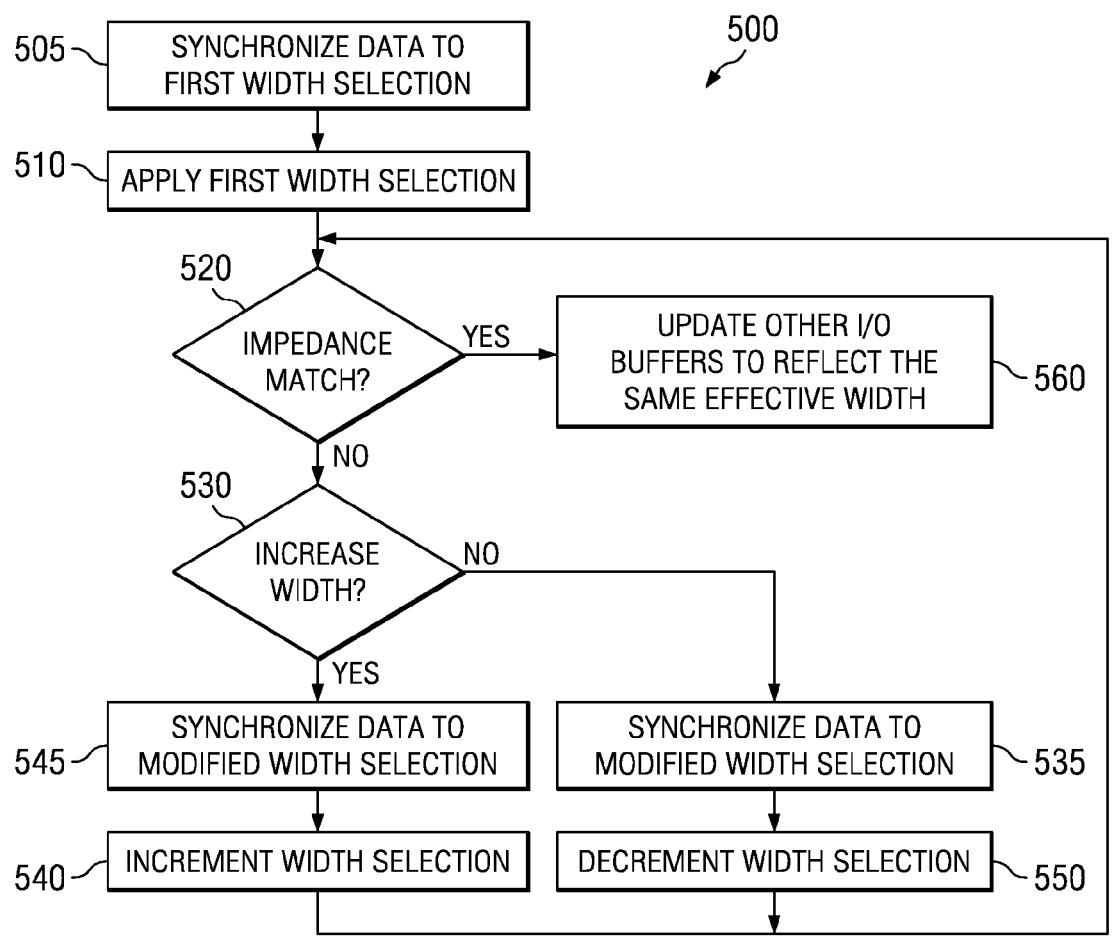
FIG. 5 is a flow diagram showing a method in accordance with some embodiments of the present invention for modifying the effective width of a transistor.

Turning to FIG. 5, a flow diagram 500 shows a method in accordance with some embodiments of the present invention for modifying the effective width of a transistor. Following flow diagram 500, a first width selection is synchronized with a data output (block 505), and the first width selection is applied (block 510). This includes asserting control outputs from a control select block such that an initial width is selected. In one particular embodiment of the present invention, the initial width that is selected is the smallest possible width (e.g., 1×). It is then determined whether an impedance match has been achieved (block 520). Where an impedance match has been achieved (block 520), the process is complete and the determined width is used to update other driver buffers where a similar impedance match is desired (block 560).

Alternatively, where an impedance match has not been achieved (block 520), it is determined whether the width needs to be increased or decreased to provide the desired impedance match (block 530). Where the width is to be increased (block 530), the control select block asserts the control outputs such that they correspond to an increase in the width of the effective transistor. The modified control outputs are synchronized with the data (block 545), and the synchronized outputs are applied to the width variable transistor such that the width of the effective transistor is increased by a determined amount (block 540). In one particular embodiment of the present invention, the determined amount is one incremental width (e.g., 1×). The process of determining whether an impedance match has been achieved is repeated (block 520). Where the width is to be increased (block 530), the control select block asserts the control outputs such that they correspond to a decrease in the width of the effective transistor. The modified control outputs are synchronized with the data (block 535), and the synchronized outputs are applied to the width variable transistor such that the width of the effective transistor is decreased by a determined amount (block 550). In one particular embodiment of the present invention, the determined amount is one incremental width (e.g., 1×). The process of determining whether an impedance match has been achieved is repeated (block 520).

Figure 6:
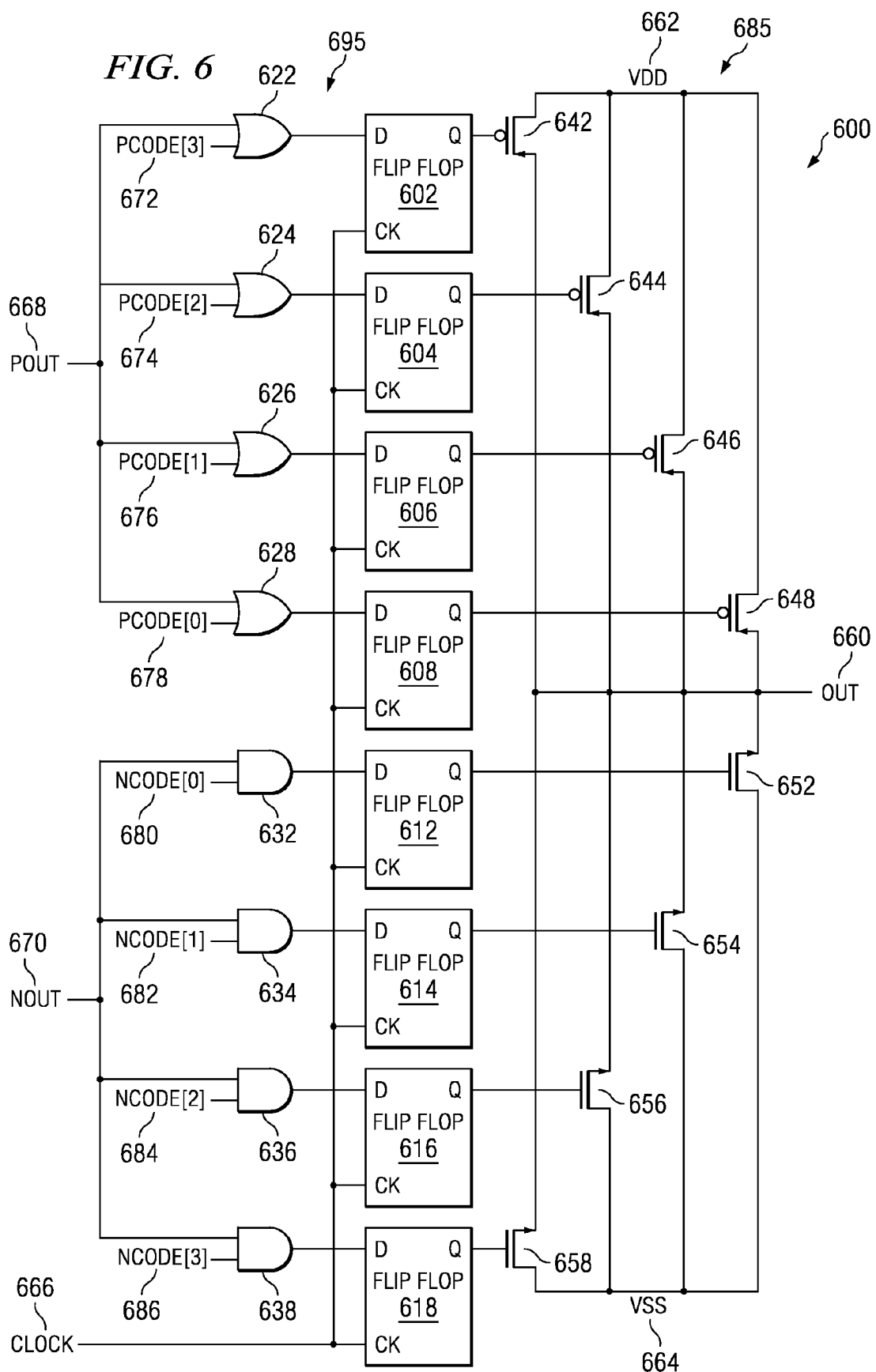
FIG. 6 shows a P/N driver combining data and control lines to drive a four stage, width selectable transistor in accordance with different embodiments of the present invention.

Turning to FIG. 6, a P/N driver 600 combining data and control lines to drive a four stage, width selectable transistor 685 in accordance with different embodiments of the present invention is shown. Transistor 685 includes four P-type transistors 642, 644, 646, 648 and four N-type transistors 652, 654, 656, 658. Each of the transistors are electrically coupled between a VDD 662 and a VSS 664. The source of P-type transistor 642 and the source of N-type transistor 658 are electrically coupled to an output 660; the source of P-type transistor 644 and the source of N-type transistor 656 are electrically coupled to output 660; the source of P-type transistor 646 and the source of N-type transistor 654 are electrically coupled to output 660; and the source of P-type transistor 648 and the source of N-type transistor 652 are electrically coupled to output 660.

P/N driver 600 further includes a controller circuit 695 that includes a number of flip-flops 602, 604, 606, 608, 612, 614, 616, 618; a number of OR gates 622, 624, 626, 628; and a number of AND gates 632, 634, 636, 638. In particular, the output of OR gate 622 drives the D-input of flip-flop 602, and the output of flip-flop 602 drives the gate of P-type transistor 642; the output of OR gate 624 drives the D-input of flip-flop 604, and the output of flip-flop 604 drives the gate of P-type transistor 644; the output of OR gate 626 drives the D-input of flip-flop 606, and the output of flip-flop 606 drives the gate of P-type transistor 646; and the output of OR gate 628 drives the D-input of flip-flop 608, and the output of flip-flop 608 drives the gate of P-type transistor 648. The output of AND gate 632 drives the D-input of flip-flop 612, and the output of flip-flop 612 drives the gate of N-type transistor 652; the output of AND gate 634 drives the D-input of flip-flop 614, and the output of flip-flop 614 drives the gate of N-type transistor 654; the output of AND gate 636 drives the D-input of flip-flop 616, and the output of flip-flop 616 drives the gate of N-type transistor 656; and the output of AND gate 638 drives the D-input of flip-flop 618, and the output of flip-flop 618 drives the gate of N-type transistor 658.

In operation, whenever a Pout signal 668 and an Nout signal 670 are asserted, output 660 is asserted. The level of drive applied to the assertion is governed by the binary Pcode and Ncode inputs (i.e., Pcode[3] 672, Pcode[2] 674, Pcode[1] 676, Pcode[0] 678, Ncode[3] 686, Ncode[2] 684, Ncode[1] 682, and Ncode[0] 680). Of note, the binary Pcode and Ncode is combined with the data signals (i.e., Nout 670 and Pout 668) before being clocked by flip-flops 602, 604, 606, 608, 612, 614, 616, 618. This assures that the transitions at the gates of transistors 642, 644, 646, 648, 652, 654, 656, 658 occur coincident with the edge of a common clock. This assures sufficient settling time for the drive transistors any time a transition is effectuated, and preceding a succeeding transition. As any toggle at the gate of one or more of transistors 642, 644, 646, 648, 652, 654, 656, 658 may result in an undesired glitch, such an approach operates to reduce the potential for glitching at output 660. Further, such an approach operates to assure that any turn-off of output 660 is synchronous, thus limiting the potential for reflections. It should be noted that the implementation of P/N driver does not incur a penalty of additional latency because of the shift in the combination of the code and the signal.

In conclusion, the present invention provides novel systems, devices, methods for glitch reduction. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A variable width driver circuit, the driver circuit comprising:
    a data output;
    a first transistor, wherein the first transistor includes a gate, a first leg and a second leg;
    a second transistor, wherein the second transistor includes a gate, a first leg and a second leg;
    wherein the gate of the first transistor is electrically coupled to a first combined control signal, wherein the gate of the second transistor is electrically coupled to a second combined control signal, wherein the first leg of the first transistor and the first leg of the second transistor are electrically coupled to a power source, and wherein the second leg of the first transistor and the second leg of the second transistor are electrically coupled to an output signal; and
    a control circuit, wherein the control circuit combines a first control signal with the data output to create the first combined control signal, and wherein the control circuit combines a second control signal with the data output to create the second combined control signal, wherein the control circuit includes data synchronizing registers to receive and synchronize the first and second combined control signals to a clock.

2. The driver circuit of claim 1, wherein combining the first control signal with the data output includes:
    applying the first control signal and the data output to a logic gate, and wherein the first combined control signal is an output of the logic gate registered synchronous to the clock.

3. The driver circuit of claim 2, wherein the logic gate is a first logic gate, wherein combining the second control signal with the data output includes:
    applying the second control signal and the data output to a second logic gate, and wherein the second combined control signal is an output of the second logic gate registered synchronous to the clock.

4. The driver circuit of claim 3, wherein the first control signal and the second control signal are part of a VTP code.

5. The driver circuit of claim 1, wherein a width of the first transistor is substantially equivalent to a width of the second transistor.

6. The driver circuit of claim 1, wherein a width of the second transistor is approximately double a width of the first transistor.

7. The driver circuit of claim 1, wherein combining the first control signal with the data output includes gating the first control signal with the data output, and wherein combining the second control signal with the data output includes gating the second control signal with the data output.

8. A method for providing driver, the method comprising:
providing a data output;
providing a first control signal and a second control signal;
providing a driver buffer, wherein the driver buffer includes:
a first transistor, wherein the first transistor includes a gate, a first leg and a second leg;
a second transistor, wherein the second transistor includes a gate, a first leg and a second leg;
wherein the gate of the first transistor is electrically coupled to a first combined control signal, wherein the gate of the second transistor is electrically coupled to a second combined control signal, wherein the first leg of the first transistor and the first leg of the second transistor are electrically coupled to a power source, and wherein the second leg of the first transistor and the second leg of the second transistor are electrically coupled to an output signal;
combining the first control signal with the data output to create the first combined control signal;
combining the second control signal with the data output to create the second combined control signal; and
receiving and synchronizing the first and second combined control signals with a clock.

9. The method of claim 8, wherein combining the first control signal with the data output includes:
applying the first control signal and the data output to a logic gate, and wherein the first combined control signal is an output of the logic gate registered synchronous to the clock.

10. The method of claim 9, wherein combining the second control signal with the data output includes:
applying the second control signal and the data output to a second logic gate, and wherein the second combined control signal is an output of the second logic gate registered synchronous to the clock.

11. The method of claim 8, wherein the first control signal and the second control signal are part of a code, and wherein a value of the code selects inclusion or exclusion of the first transistor and the second transistor.

12. The method of claim 11, wherein a width of the first transistor is substantially equivalent to a width of the second transistor.

13. The method of claim 11, wherein a width of the second transistor is approximately double a width of the first transistor.

14. A driver system, the system comprising:
a data output; a first combined control signal;
a second combined control signal;
a driver buffer, wherein the driver buffer includes:
a first transistor, wherein the first transistor includes a gate, a first leg and a second leg;
a second transistor, wherein the second transistor includes a gate, a first leg and a second leg;
wherein the gate of the first transistor is electrically coupled to the first combined control signal, wherein the gate of the second transistor is electrically coupled to the second combined control signal, wherein the first leg of the first transistor and the first leg of the second transistor are electrically coupled to a power source, and wherein the second leg of the first transistor and the second leg of the second transistor are electrically coupled to an output signal; a driver controller, wherein the driver controller includes:
a control select circuit, wherein the control select circuit provides a first control output and a second control output,
a combining circuit, wherein the combining circuit is operable to combine the first control signal with the data output to create the first combined control signal, and wherein the combining circuit is operable to combine the second control signal with the data output to create the second combined control signal, the combining circuit includes data synchronizing registers to receive and synchronize the first and second combined control signals to a clock.

15. The driver system of claim 14, wherein combining the first control signal with the data output includes gating the first control signal with the data output, and wherein combining the second control signal with the data output includes gating the second control signal with the data output.

16. The driver system of claim 14, wherein a width of the first transistor is substantially equivalent to a width of the second transistor.

17. The driver system of claim 14, wherein a width of the second transistor is approximately double a width of the first transistor.

18. The driver system of claim 14, wherein combining the first control signal with the data output includes:
applying the first control signal and the data output to a logic gate, and wherein the first combined control signal is an output of the logic gate registered synchronous to the clock.

19. The driver system of claim 18, wherein the logic gate is a first logic gate, wherein combining the second control signal with the data output includes:
applying the second control signal and the data output to a second logic gate, and wherein the second combined control signal is an output of the second logic gate registered synchronous to the clock.

* * * * *